United States Patent
Dai

(10) Patent No.: US 8,137,121 B2
(45) Date of Patent: Mar. 20, 2012

(54) FASTENER AND ELECTRIC CONNECTOR DEVICE HAVING THE SAME

(75) Inventor: Yung-Jiun Dai, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/912,843

(22) Filed: Oct. 27, 2010

(65) Prior Publication Data

US 2011/0294330 A1    Dec. 1, 2011

(30) Foreign Application Priority Data

Jun. 1, 2010  (CN) ............... 2010 2 0222066 U

(51) Int. Cl.
*H01R 13/44* (2006.01)
(52) U.S. Cl. .......... 439/135; 439/331; 439/940; 439/41
(58) Field of Classification Search .......... 439/331, 439/73, 330, 940, 135, 41
See application file for complete search history.

(56) References Cited

U.S. PATENT DOCUMENTS

| 7,033,188 B2 * | 4/2006 | Ma .............................. 439/135 |
| 7,819,688 B2 * | 10/2010 | Terhune et al. ............. 439/331 |

FOREIGN PATENT DOCUMENTS

CN           2665971 Y    12/2004

* cited by examiner

*Primary Examiner* — Javaid Nasri
(74) *Attorney, Agent, or Firm* — Rosenberg, Klein & Lee

(57) ABSTRACT

A fastener for securing a chip module onto a circuit board includes a fixing bracket mounted on the circuit board; a pressing frame covering the chip module; a lever having a driving portion and a shaft portion, wherein the shaft portion is formed by extending and bending from the driving portion, with the shaft portion running through the fixing bracket and the pressing frame for controlling the forward and backward rotation of the pressing frame; a protective cover mounted on the pressing frame, wherein a projection portion is formed on a bottom surface of the protective cover and located at the rear end of the chip module, and the projection portion has a slant surface adjacent to the chip module; and thereby, when the pressing frame moves forward, the slant surface presses against the chip module.

12 Claims, 6 Drawing Sheets

FASTENER AND ELECTRIC CONNECTOR DEVICE HAVING THE SAME

BACKGROUND OF THE INVENTION

1. Field of the Invention

The present invention relates to a fastener, more particularly to a fastener for an electric connector device which electrically connects a chip module onto a circuit board.

2. Description of the Related Art

CN patent No. 03273198.1 discloses an electric connector device, which has a pickup device that can be manually removed with ease. Said electric connector device includes an electric connector and a pickup device. The electric connector includes an insulating body housing a plurality of terminals, a support plate mounted around the insulating body, both an actuating element and a clip connected pivotally to the support plate. The pickup device mounts on the clip by means of a first latch and a second latch on the sides of the pickup device, which catch onto the sides of the clip. The pickup device has a suction portion with a protrusion on the outer edge thereof.

To the proper use of the electric connector, a vacuum nozzle is used for drawing the suction portion and placing the electric connector onto a circuit board for soldering. After soldering, the clip is released to receive a chip module. Upon proper placement of the chip module, the clip is re-engaged to secure the chip module onto the circuit board. The chip module needs to be cooled by an external heat sink at work. To allow proper heat dissipation, the pickup device needs to be removed after insertion of the chip module.so that the external heat sink can be placed onto the chip module.

In the above electric connector, the protrusion enables the pickup device to be manually dislodged by releasing the first and the second latch off the sides of the clip. However, such procedure is tedious and hinders the improvement of assembling efficiency, requiring higher manual labor and higher manufacturing costs.

Therefore, a better electric connector device is needed to overcome the above shortage.

SUMMARY OF THE INVENTION

The object of the instant disclosure is to provide a fastener that releases a protective cover automatically.

To achieve the aforementioned object, the fastener for securing a chip module onto a circuit board comprises a fixing bracket mounted on the circuit board; a pressing frame covering the chip module; a lever having a driving portion and a shaft portion, wherein the shaft portion is formed by extending and bending from the driving portion, with the shaft portion running through the fixing bracket and the pressing frame for controlling the forward and backward rotation of the pressing frame; and a protective cover mounted on the pressing frame, wherein a projection portion is formed on a bottom surface of the protective cover and located at the rear end of the chip module. The projection portion has a slant surface adjacent to the chip module; when the pressing frame moves forward, the slant surface presses against the chip module.

The instant disclosure further provides an electric connector device that releases a protective cover automatically.

According to the instant disclosure, the electric connector device used to electrically connect a chip module to a circuit board includes a fixing bracket mounted on the circuit board; an electric socket mounted on the circuit board for receiving the chip module; a pressing frame covering the chip module; a lever having a driving portion and a shaft portion, wherein the shaft portion is formed by extending and bending from the driving portion, with the shaft portion running through the fixing bracket and the pressing frame for controlling the forward and backward rotation of the pressing frame; and a protective cover mounted on the pressing frame, wherein a projection portion is formed on a bottom surface of the protective cover and located at the rear end of the chip module, and the projection portion has a slant surface adjacent to the chip module; and when the pressing frame moves forward, the slant surface presses against the chip module.

Compared to the prior art, the fastener and the electric connector device of the instant disclosure have the slant surface. When the pressing frame rotates forward, the slant surface presses against the chip module. The counter force exerted by the chip module against the slant surface gradually increases, eventually pushing the protective cover to be automatically released from the pressing frame. The instant disclosed fastener structure may offer better assembly efficiency, thereby lowering manual labor requirement and manufacturing cost.

For better understanding of the instant disclosure, the following embodiments are provided along with illustrations to facilitate the disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
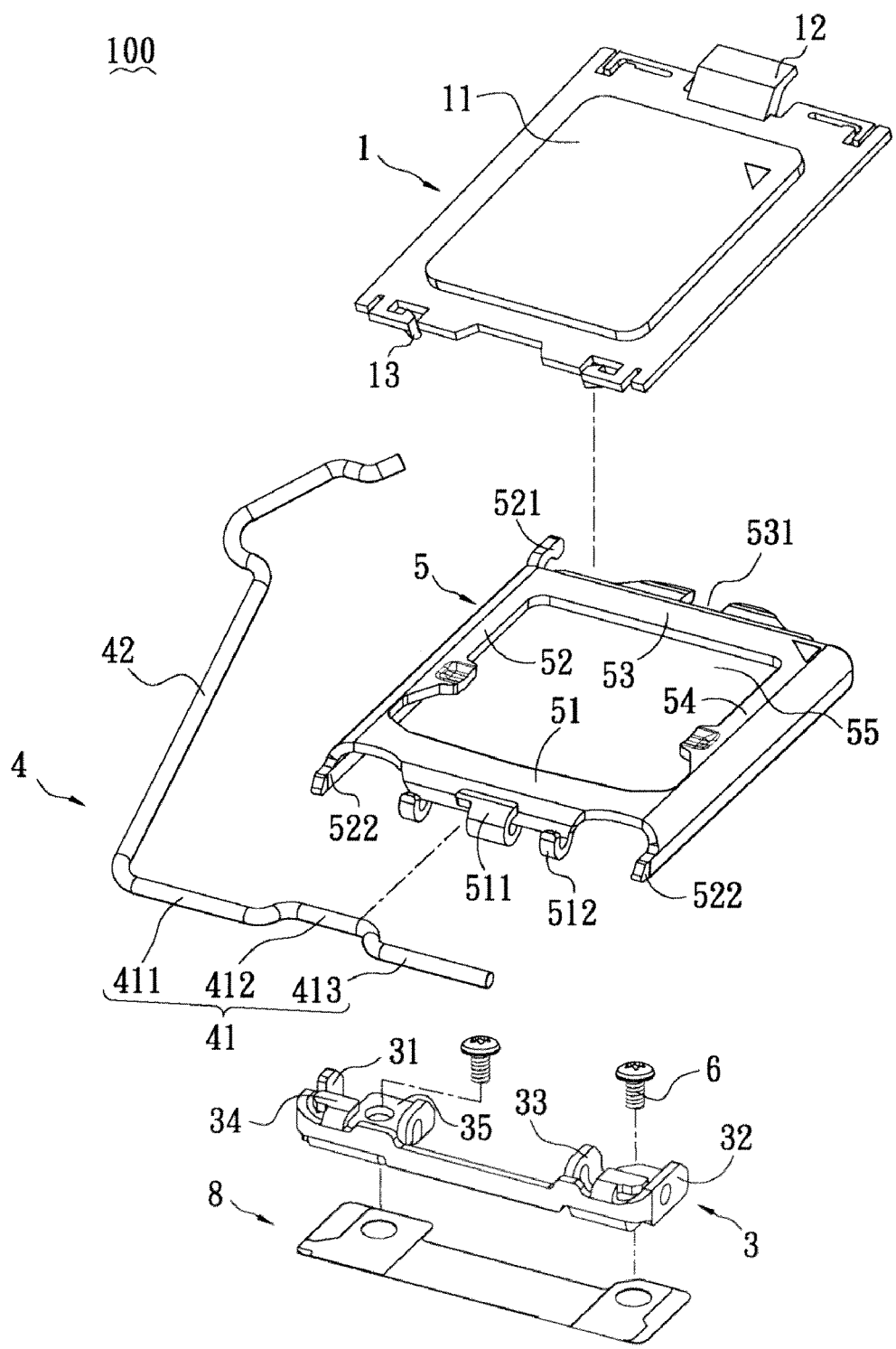
FIG. 1 is an exploded view of an electric connector device according to a preferred embodiment of the instant disclosure.
Figure 2:
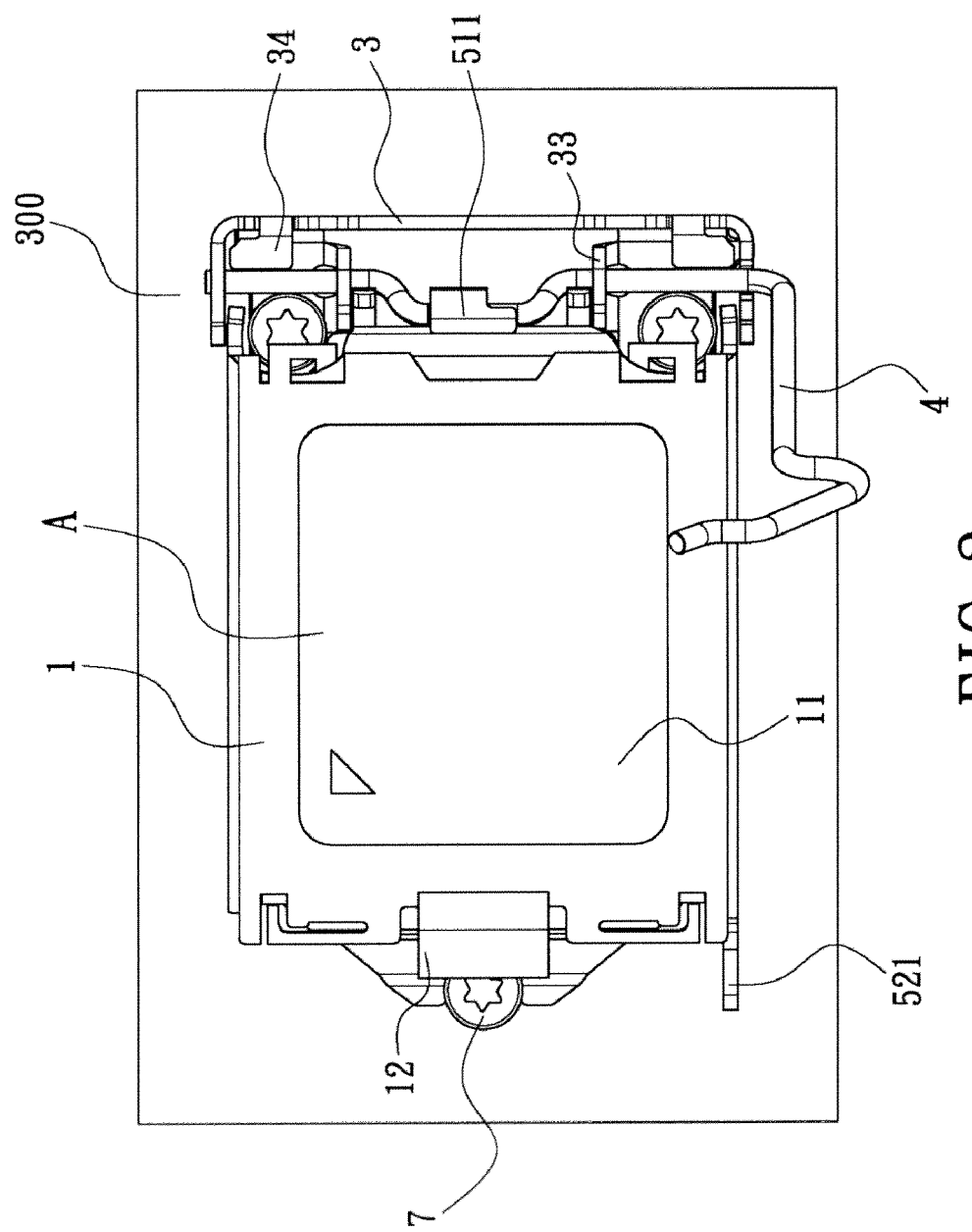
FIG. 2 is a top view of an electric connector device in FIG. 1 mounted on a circuit board.
Figure 5:
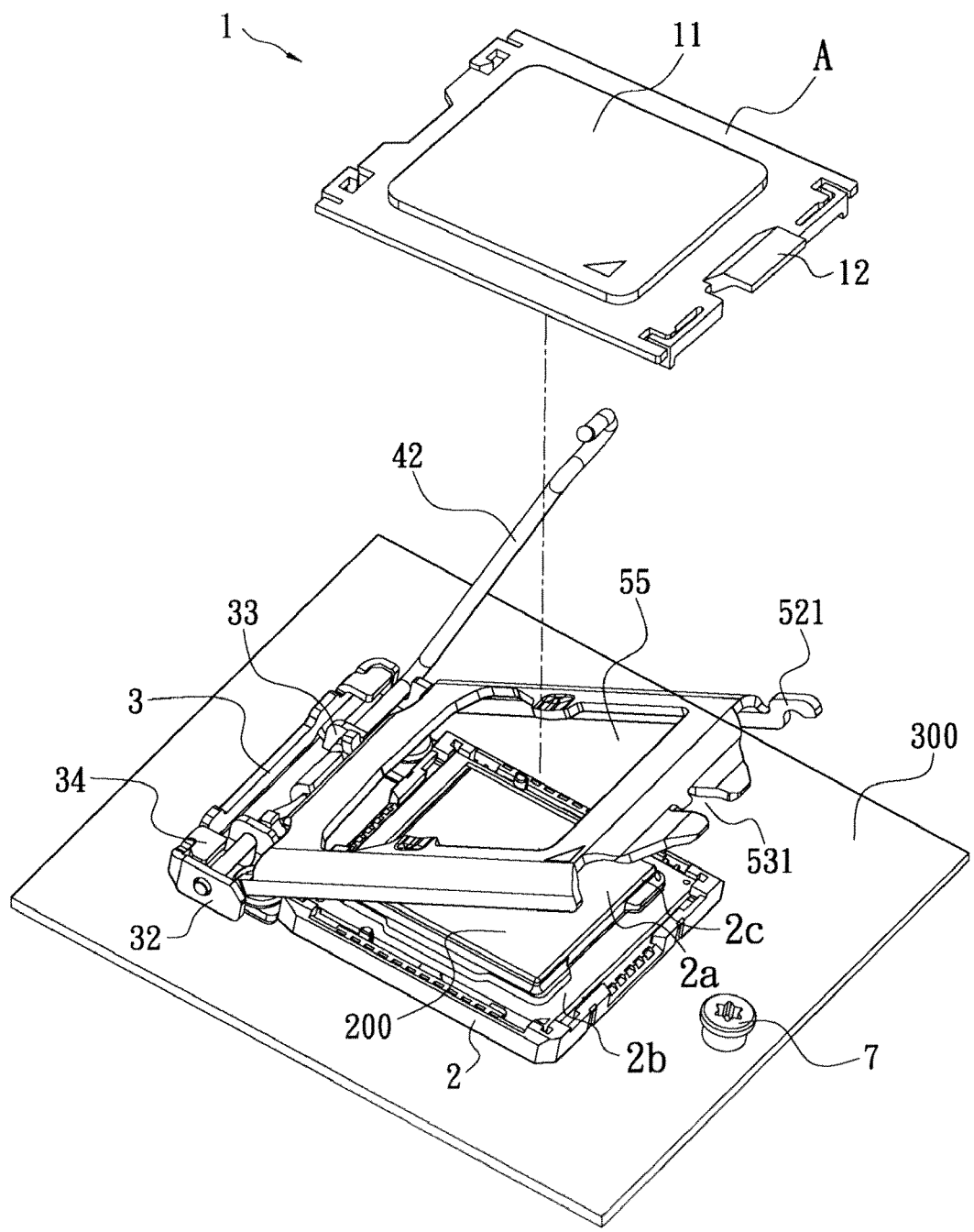
FIG. 5 is a schematic view of an electric connector device in FIG. 1 connecting a chip module to a circuit board.

According to the instant disclosure, FIG. 1, FIG. 2 and FIG. 5 show the electric connector device for electrically coupling a chip module 200 onto a circuit board 300. The electric connector device comprises a fastener 100 and an electric socket 2. The fastener 100 has a fixing bracket 3 mounted on the circuit board 300; a lever 4 pivotally connected to the fixing bracket 3; a pressing frame 5 connected to the lever 4; and a protective cover 1 covering the pressing frame 5. For receiving the chip module 200, the electric socket 2 is mounted on the circuit board 300. In turn, the fastener 100 secures the chip module 200 firmly onto the circuit board 300.

Figure 3:
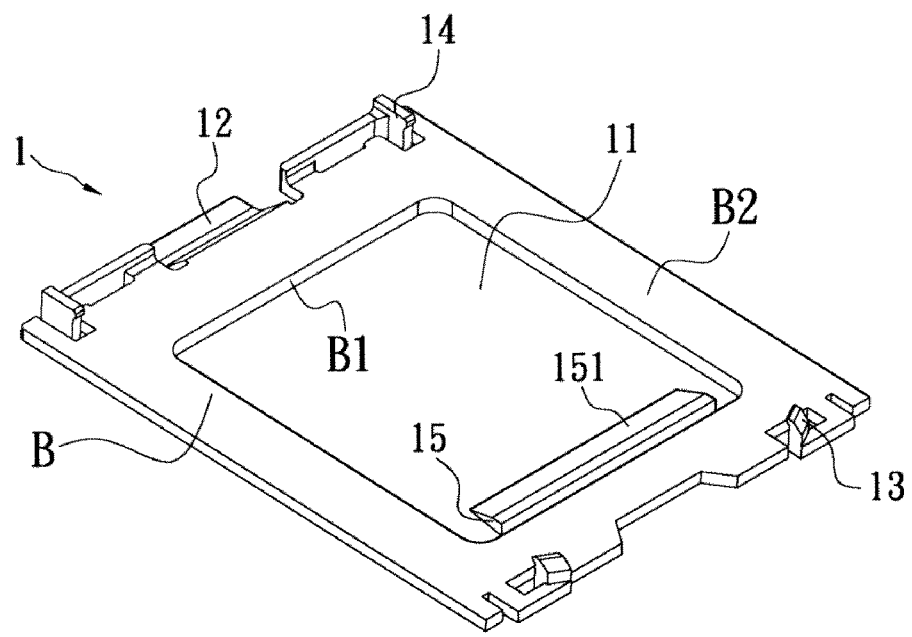
FIG. 3 is a perspective view of a protective cover in FIG. 1.

Please refer to FIG. 3. The protective cover 1 has a top surface A and a bottom surface B. The center of the top surface A defines a suction portion 11, which is elevated in comparison to the surrounding edge portion. The bottom surface B has a side wall B1 corresponding to the elevated suction portion 11 along with a lower surface B2 corresponding to the edge of the top surface A. Part of the front end of the protective cover 1 extends upward to form a protrusion 12, which allows an operator to accurately install the protective cover 1 on or remove the protective cover 1 from the pressing frame 5. The rear end of the protective cover 1 has at least one downward extension forming a first latch 13, while the front end of the protective cover 1 has at least one downward extension forming a second latch 14. Furthermore, a projection portion 15 is formed on the bottom surface B of the protective cover 1. With reference to the corresponding suction portion 11, the projection portion 15 is located on the flip side of the protective cover 1 near the rear end. The projection portion 15 has a slant surface 151.

Please refer to FIG. 1. The fixing bracket 3 may be of one-piece construction and has a first pivot 31 and a second pivot 32 formed on the opposite ends respectively. A pair of blocking members 33 is located in between the first pivot 31 and the second pivot 32. Two stoppers 34 are formed on the fixing bracket 3 and extend generally upward from the upper portion thereof, while two positioning members 35 are formed on and extend from the bottom portion of the fixing bracket 3. Each stopper 34 is correspondingly paired to a positioning member 35.

Generally, the lever 4 is L-shaped with a shaft portion 41 and a driving portion 42 bent from the shaft portion 41. The shaft portion 41 comprises three sections: a first straight section 411, a second straight section 413, and a curved section 412 connecting the first straight section 411 to the second straight section 413.

The pressing frame 5 is made up by the first side 51, the second side 52, the third side 53, and the fourth side 54. Bounded at all four sides, an opening 55 is formed accordingly. An embedding part 511 and two limiting parts 512 are formed by extending from the first side 51, where the embedding part 511 is between the two limiting parts 512. An engaging part 521 is formed by extending from one end of the second side 52, while a hinge member 522 is formed by extending from the other end of the second side 52. The third side 53 extends forward to form an "U" shaped retaining member 531, and one end of the fourth side 54 extends backward to form another hinge member 522.

Next, FIG. 5 shows the assembled fastener 100 and the mounting of the electric socket 2 onto the circuit board 300 for soldering, where the electric socket 2 includes an insulating body and a plurality of terminals within the insulating body. The fastener 100 is then mounted onto the circuit board 300.

For assembling the fastener 100, the pressing frame 5 is first joined to the fixing bracket 3 via the lever 4. The shaft portion 41 sequentially passes through the first pivot 31, the first blocking member 33, the embedding part 511, the second blocking member 33, and the second pivot 32. The curved section 412 corresponds to the embedding part 511, and the limiting parts 512 are located in between the stoppers 34.

Next, at least one fixing element 6, such as a screw, is used to anchor the fixing bracket 3 onto the circuit board 300 through slotted holes of the positioning members 35. An insulating sheet 8 is disposed between the fixing bracket 3 and the circuit board 300.

Next, the protective cover 1 is engaged onto the pressing frame 5, where the first latch 13 catches onto the bottom edge of the first side 51, and the second latch 14 catches onto the bottom edge of the third side 53.

In operation, the driving portion 42 is levered by the user to move the pressing frame 5 with respect to the fixing bracket 3. When the driving portion 42 is rotated away from the front end of the pressing frame 5, the curved section 412 is gradually elevated with respect to the circuit board 300. In turn, the hinge members 522 are gradually moved such that the hinge members 522 raise above the shaft portion 41 and presses against the front edges of the stoppers 34. As the lever 4 rotates, the stoppers 34 generate a counter force against the hinge members 522, where the hinge members 522 act as the pivot points for the rotating pressing frame 5. At such moment, the pressing frame 5 establishes an "OPEN" position relative to the circuit board 300.

Figure 6:
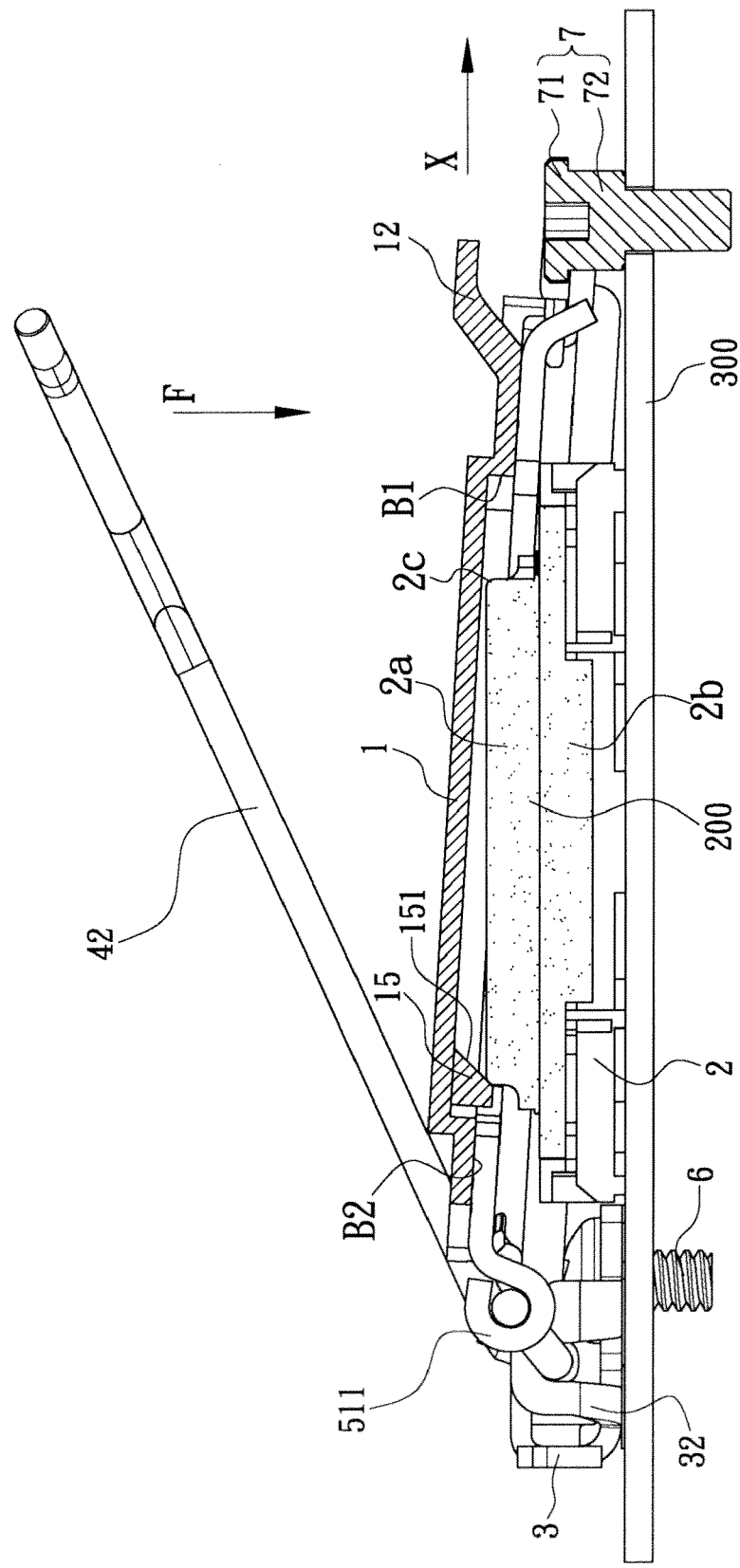
FIG. 6 is a schematic view of a protective cover of an electric connector device in FIG. 1 pressing against a chip module.

As shown by direction F in FIG. 6, when the driving portion 42 is rotated toward the front edge of the pressing frame 5, the curved section 412 is gradually lowered toward the circuit board 300. In turn, with respect to the circuit board 300, the pressing frame 5 progresses gradually from a tilted position, where the rear end is higher than the front end, to a roughly parallel position. As shown in FIG. 6, the direction in which the pressing frame 5 is pivoted from a tilted state to a roughly parallel state with respect to the circuit board 300 is denoted as forward movement shown by arrow X. Meanwhile, the retaining member 531 gradually locks onto a fastening element 7 of the circuit board 300. The fastening element 7 has a head 71 and a main body 72, where the head 71 has a larger diameter than the main body 72. When the end of the driving portion 42 engages onto the engaging part 521, the pressing frame 5 establishes a "CLOSED" position with respect to the circuit board 300.

Figure 7:
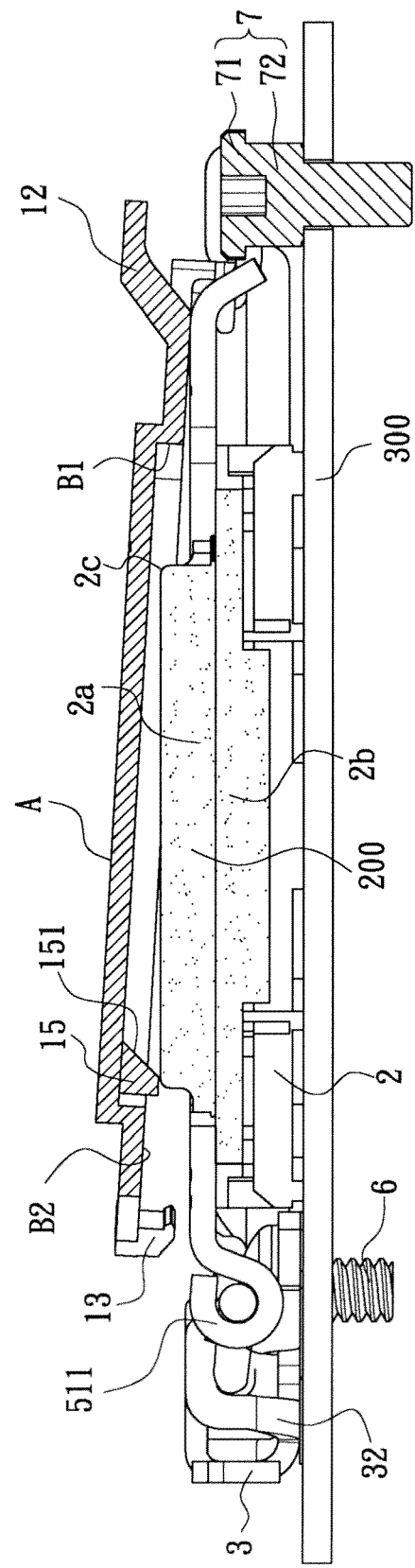
FIG. 7 is a schematic view of a protective cover of an electric connector device in FIG. 1 releasing automatically.

After the electric connector device is mounted onto the circuit board 300, the chip module 200 is to be installed next. To install the chip module 200, the fastener 100 needs to be at the "OPEN" position. The chip module 200 includes a base 2b and a circuit part 2a laminated over the base 2b. The circuit part 2a is rectangular with edges 2c. The base 2b is placed on the electric socket 2, and the circuit part 2a corresponds to the opening 55 and the suction portion 11. As shown in FIG. 6, when transitioning from "OPEN" to "CLOSED" position, the protective cover 1 moves along with the pressing frame 5 toward the chip module 200. As the slant surface 151 comes in contact with the edge 2c of the chip module 200, the retaining member 531 locks underneath the head 71 and thereby fixing the chip module 200 onto the circuit board 300. Next, the protective cover 1 moves along with the pressing frame 5 in a forward direction, with the slant surface 151 pressing against the chip module 200. As the counter force exerted by the chip module 200 against the projection portion 15 increases, the fastening effect of the first latch 13 to the first side 51 diminishes accordingly. Along the way, the first latch 13 moves backward relative to the chip module 200. When nearing or at the "CLOSED" position, the counter force is large enough to overcome the fastening force of the first latch 13 and the second latch 14 to the pressing frame 5. In turn, the protective cover 1 is released automatically as shown in FIG. 7.

Figure 4:
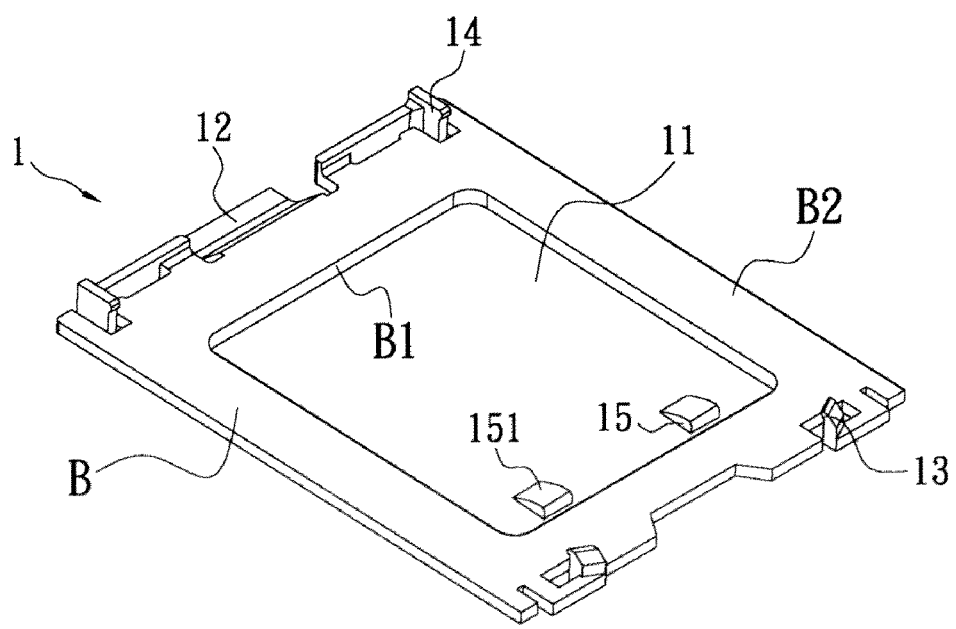
FIG. 4 is a perspective view of a protective cover in FIG. 1 according to another embodiment of the instant disclosure.

The electric connector device of the instant disclosure has the following advantages:

(1) As shown in FIGS. 3 and 4, the projection portion 15 can be formed integrally with the protective cover 1, or disposed onto the protective cover 1 as a separate unit. The slant surface 151 can be flat, curved, or any other shape, as long as the counter force exerted by the chip module 200 against the slant surface 151 gradually increases while the pressing frame 5 is moving forward. As a buffer, the counter force prevents the chip module 200 from exerting large pressure suddenly to the electric socket 2, thus protecting the terminals within the electric socket 2 for improving electric connection.

(2) As shown in FIG. 6, when the protective cover 1 is placed on the pressing frame 5, the lower surface B2 of the protective cover 1 comes close to the upper surface of the pressing frame 5, which prevents any dusts or debris from entering into the electric socket 2.

(3) When the pressing frame 5 moves forward, the retaining member 531 gradually locks onto the main body 72 of the fastening element 7 on the circuit board 300. When the end of the driving portion 42 engages with the engaging part 521, the retaining member 531 is completely locked onto the main body 72. When the pressing frame 5 moves backward, the retaining member 531 gradually releases from the fastening element 7. The forward and backward movement of the pressing frame 5 is controlled by levering the driving portion 42, which can be easily operated.

(4) The protective cover 1 is released automatically, which saves manual labor, simplifies the manufacturing process, and thereby increases efficiency.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A fastener for securing a chip module onto a circuit board, comprising:
    a fixing bracket mounted on the circuit board;
    a pressing frame covering the chip module;
    a lever having a driving portion and a shaft portion, wherein the shaft portion bendingly extends from the driving portion, wherein the shaft portion of the lever is disposed through the fixing bracket and the pressing frame for controlling the forward and backward rotation of the pressing frame; and
    a protective cover having a top surface and a bottom surface mounted on the pressing frame, wherein a projection portion is formed on the bottom surface of the protective cover and located behind of the chip module, wherein the projection portion has a slant surface adjacent to the chip module;
    whereby when the pressing frame moves forward, the slant surface presses against the chip module.

2. The fastener according to claim 1, wherein the projection portion is formed integrally with the protective cover.

3. The fastener according to claim 1, wherein the projection portion is formed separately from the protective cover, and the projection portion is attached to the protective cover.

4. The fastener according to claim 1, wherein the slant surface is flat.

5. The fastener according to claim 1, wherein the slant surface is curved.

6. The fastener according to claim 1, wherein the top surface of the protective cover is elevated to form a suction portion, wherein the suction portion has opposing top surface and bottom surface, and wherein the projection portion is on the bottom surface of the protective cover corresponding to the suction portion.

7. The fastener according to claim 1, wherein an opening is formed in a center of the pressing frame, and the projection portion meets the chip module through the opening 8. The fastener according to claim 1, wherein the protective cover has a first latch and a second latch, wherein the pressing frame has opposite front end and rear end, and wherein the first latch catches onto the rear end of the pressing frame, and the second latch catches onto the front end of the pressing frame.

9. The fastener according to claim 8, wherein the front end of the pressing frame has a retaining member.

10. An electric connector device for electrically coupling a chip module to a circuit board, comprising:
    a fixing bracket mounted on the circuit board;
    an electric socket mounted on the circuit board for receiving the chip module;
    a pressing frame covering the chip module;
    a lever having a driving portion and a shaft portion, wherein the shaft portion bendingly extends from the driving portion, wherein the shaft portion is disposed through the fixing bracket and the pressing frame for controlling the forward and backward rotation of the pressing frame; and
    a protective cover having a top surface and a bottom surface mounted on the pressing frame, wherein a projection portion is formed on the bottom surface of the protective cover and located behind the chip module, wherein the projection portion has a slant surface adjacent to the chip module;
    whereby when the pressing frame moves forward, the slant surface presses against the chip module.

11. The electric connector device according to claim 10, wherein the electric connector device has a fastening element fixed on the circuit board; the fastening element has a head and a main body, wherein the head has a larger diameter than the main body.

12. The electric connector device according to claim 11, wherein a retaining member is formed at the front end of the pressing frame; an opening of the retaining member is smaller than the diameter of the head of the fastening element; when the slant surface presses against the chip module, the retaining member locks onto the main body of the fastening element.

\* \* \* \* \*